(12) United States Patent
Noguchi et al.

(10) Patent No.: US 6,470,471 B1
(45) Date of Patent: Oct. 22, 2002

(54) DATA ERROR CORRECTION APPARATUS

(75) Inventors: Nobuaki Noguchi, Ehime (JP); Takahiro Watanabe, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/506,319

(22) Filed: Feb. 18, 2000

(30) Foreign Application Priority Data

Feb. 19, 1999 (JP) .......................................... 11-042187

(51) Int. Cl.$^7$ ............................................. H03M 13/00
(52) U.S. Cl. ..................................................... 714/782
(58) Field of Search ................................. 714/782, 784, 714/785

(56) References Cited

U.S. PATENT DOCUMENTS

| | | | | |
|---|---|---|---|---|
| 5,130,990 A | * | 7/1992 | Hsu et al. | 714/784 |
| 5,912,905 A | * | 6/1999 | Sakai et al. | 714/784 |
| 6,158,038 A | * | 12/2000 | Yamawaki et al. | 714/755 |

FOREIGN PATENT DOCUMENTS

JP           5-55926        3/1993

* cited by examiner

*Primary Examiner*—Albert Decady
*Assistant Examiner*—Shelly A Chase
(74) *Attorney, Agent, or Firm*—Wenderoth, Lind & Ponack, L.L.P.

(57) ABSTRACT

A data error correction apparatus includes sixteen units of syndrome calculators for calculating syndromes of one code word of an octuple error correcting Reed-Solomon code, and these calculators comprise Galois field adders, flip-flops, and first constant multipliers for calculating elements of Galois field, respectively. Further, some of these syndrome calculators are provided with second constant multipliers for calculating elements of Galois field, and selectors for selecting either the first constant multipliers or the second constant multipliers, thereby realizing syndrome calculators capable of simultaneously processing eight code words of a single error correcting Reed-Solomon code. Therefore, the number!of code words to be processed in parallel in syndrome calculation for an error correcting code having relatively low error-correcting ability is increased by effectively utilizing the syndrome calculators for an error correcting code having relatively high error-correcting ability, whereby high-speed error correction is realized.

1 Claim, 3 Drawing Sheets

DATA ERROR CORRECTION APPARATUS

FIELD OF THE INVENTION

The present invention relates to a data error correction apparatus for correcting data errors by using a plurality of error correcting codes.

BACKGROUND OF THE INVENTION

As a technique for improving the reliability of a data processing system, error correcting codes (ECC) for correcting errors in data have been applied to various kinds of equipment. Especially BCH (Bose-Chaundhuri-Hocqenghen) codes including Reed-Solomon codes are regarded as important because of the high efficiency. Assuming that a primitive polynomial is W(z) and a root of W(z)=0 is α, a Reed-Solomon code is a code on a Galois field having this root a as a primitive element, and it is a kind of a block error correcting code.

FIG. 3 is a block diagram illustrating the structure of an error correction apparatus disclosed in Japanese Published Patent Application No. Hei.5-55926. This error correction apparatus comprises a data memory 72 for storing input data, syndrome calculation circuits 76 and 78 for calculating syndromes of multiple error correcting codes added to the input data, a syndrome memory for storing the syndromes calculated by the syndrome calculation circuits 76 and 78, and an error detection and correction circuit 86 for reading the syndromes stored in the syndrome memory 80 and correcting the error data in the data memory 72. Further, an OR circuit 82 ORs all bits of the calculated syndromes, and the result is stored in a flag memory 84 as flag data indicating data errors. Further, a timing control circuit 88 controls the operation timing of the error correction apparatus. The syndrome calculation circuit 76 comprises adders 20, 22, and 24, delay units 26, 28, and 30, and constant multipliers 32 and 34 for the element of the Galois field, while the syndrome calculation circuit 78 comprises adders 36, 38, and 40, delay units 42, 44, 46, 52, 54, and 56, and constant multipliers 48 and 50. Assuming that input data is Wi and the root of the generating polynomial is am, syndromes S0, S1, and S2 are calculated according to the following formulae (1), (2), and (3).

$$S0 = \sum_{i=1}^{n} Wi \quad (1)$$

$$S1 = \sum_{i=1}^{n} Wi a^{n-i} \quad (2)$$

$$S2 = \sum_{i=1}^{n} Wi(\alpha^2)^{n-i} \quad (3)$$

Then, the error detection and correction circuit 86 reads the syndromes S0, S1, and S2 from the syndrome memory 80. When at least one of these syndromes is not "0", the position and size of error are calculated according to S0–S2, and the error data in the input data stored in the data memory 72 are corrected according to the result.

In this error correction apparatus, simultaneously with writing the input data applied to the input terminal 70 into the data memory 72, the syndrome calculators 76 and 78 calculate syndromes of the error correcting codes added to the input data, and data errors are corrected on the basis of the syndromes. The corrected data are output from the output terminal 74.

Generally, when performing error correction by using a t-fold (t=integer, t≧1) error correcting BCH code, 2t syndromes are calculated. For example, in a digital audio tape recorder (DAT), a triple error correcting Reed-Solomon code and a double error correcting Reed-Solomon code are added to correct data errors. In this case, for one code word, six syndromes are calculated for the triple error correcting Reed-Solomon code, and four syndromes are calculated for the double error correcting Reed-Solomon code.

FIG. 2 shows the structure of a conventional syndrome calculation circuit used in a data error correction apparatus. The syndrome calculation circuit comprises six syndrome calculators 300~305, and these calculators 300~305 are provided with data input terminals 320~325, Galois field adders 340~345, flip-flops 360~365 as delay units, and constant multipliers 380~385 for calculating the 0th to 5th powers of an element α of Galois field (hereinafter referred to as α^0~α^5 ). In these syndrome calculators 300~305, every time data of a code word are input to the input terminals 320~325, starting from the head data, the data held in the flip-flops 360~365 are subjected to constant multiplication in the constant multipliers 380~385, and the constant-multiplied data and the input data are added in the adders 340~345, respectively. Then, the data held by the flip-flops 360~365 are updated with the data output from the adders 340~345, whereby syndromes of the error correcting code are calculated. For example, since six syndromes are calculated for the triple error correcting Reed-Solomon code, when calculating the syndromes of the triple error correction Reed-Solomon code by using the syndrome calculators, all of the six syndrome calculators 300~305 are used. On the other hand, since four syndromes are calculated for the double error correcting Reed-Solomon code, when the syndromes of the double error correcting Reed-Solomon code are calculated by using the syndrome calculators, only four syndrome calculators 300~303 of relatively low correction abilities are used, and the results from the remaining two syndrome calculators 304 and 305 are not used.

As described above, in the conventional syndrome calculation circuit, syndrome calculations for error correcting codes of different correction abilities, such as the triple error correcting Reed-Solomon code and the double error correcting Reed-Solomon code, are realized by using common hardware. In this case, however, since a difference in error-correcting abilities between the triple error correcting Reed-Solomon code and the double error correcting Reed-Solomon is small, the number of code words to be processed in the syndrome calculation for the triple error correcting Reed-Solomon code should be equal to the number of code words to be processed in the syndrome calculation for the double error correcting Reed-Solomon code. That is, only one code word is processed at one time in both of these syndrome calculations. Especially when the code length is large or the code word has no error, since the error correcting speed of the error correction apparatus is regulated by the syndrome calculation, the efficiency of syndrome calculation should be increased to increase the error correcting speed.

By the way, in a data error correction apparatus for a DVD-ROM, not only data in a DVD-ROM but also data in a CD-ROM or a CD-R should be processed. Since an octuple error correcting Reed-Solomon code and a quintuple error correcting Reed-Solomon code are added to the DVD-ROM while a single error correcting Reed-Solomon code is added to the CD-ROM, syndrome calculations for error correcting codes having greatly different error-correcting abilities are required. In this case, in the syndrome calculation circuit shown in FIG. 2, since sixteen syndromes are calculated for the high error-correcting ability code applied to the DVD-ROM, such as the octuple error correcting Reed-Solomon code, sixteen units of syndrome calculators are required for this calculation. Accordingly, in a data error correction apparatus having such syndrome calculation circuit, by using the sixteen syndrome calculators performing syndrome calculation for a high error-correcting ability code, two syndromes are calculated for a low error-correcting ability code such as the single error correcting Reed-Solomon code. Therefore, when calculating the two syndromes, only two syndrome calculators amongst the sixteen syndrome calculators are used while the remaining fourteen syndrome calculators are not used. Especially when processing plural codes of different error correcting abilities by using a common syndrome calculation circuit, a lot of unused syndrome calculators exist when calculating syndromes of a lower error-correcting ability code, whereby the efficiency of the syndrome calculation is degraded, resulting in difficulty in increasing the data correcting speed.

SUMMARY OF THE INVENTION

The present invention is made to solve the above-described problems and has for its object to provide a data error correction apparatus including a syndrome calculation circuit for processing plural codes of different error-correcting abilities, in which syndrome calculation for a code having relatively low error-correcting ability can be performed in parallel to increase the error correcting speed.

Other objects and advantages of the invention will become apparent from the detailed description that follows. The detailed description and specific embodiments described are provided only for illustration since various additions and modifications within the scope of the invention will be apparent to those of skill in the art from the detailed description.

According to an aspect of the present invention, there is provided a data error correction apparatus for correcting errors in data to which an n-fold (n: integer, $n \geq 1$) error correcting BCH code is added, which n is equal to or larger than 2t (t: integer, $t \geq 1$). The apparatus includes 2n units of syndrome calculators each comprising a first constant multiplier for obtaining an element of Galois field which is used for calculating syndromes of the n-fold ($n \geq 2t$) error correcting BCH code, an adder for adding data obtained in the first constant multiplier and input data supplied from an input terminal, and a delay unit for updating the retained data with the data output from the adder. In this apparatus, when correcting errors in data to which a t-fold error correcting BCH code is added, in order that the number of code words to be processed in parallel by syndrome calculation for the t-fold error correcting BCH becomes at least twice as large as the number of code words to be processed by syndrome calculation for the n-fold ($n \geq 2t$) error correcting BCH code, at least 2t units of syndrome calculators among the 2n units of syndrome calculators, other than 2t units of syndrome calculators having relatively low error-correcting abilities, are each provided with a second constant multiplier for obtaining an element of Galois field, which is used for calculating syndromes of the t-fold error correcting BCH code, and a selector for connecting the adder to one of the first constant multiplier and the second constant multiplier. Therefore, the processing speed of syndrome calculation for the t-fold error correcting BCH code having relatively low error-correcting ability is increased by effectively utilizing the syndrome calculators for the n-fold ($n \geq 2t$) error correcting BCH code having relatively high error-correcting ability, whereby high-speed error correction is realized.

DETAILED DESCRIPTION OF THE PREFERRED EMBODIMENTS

Figure 1:
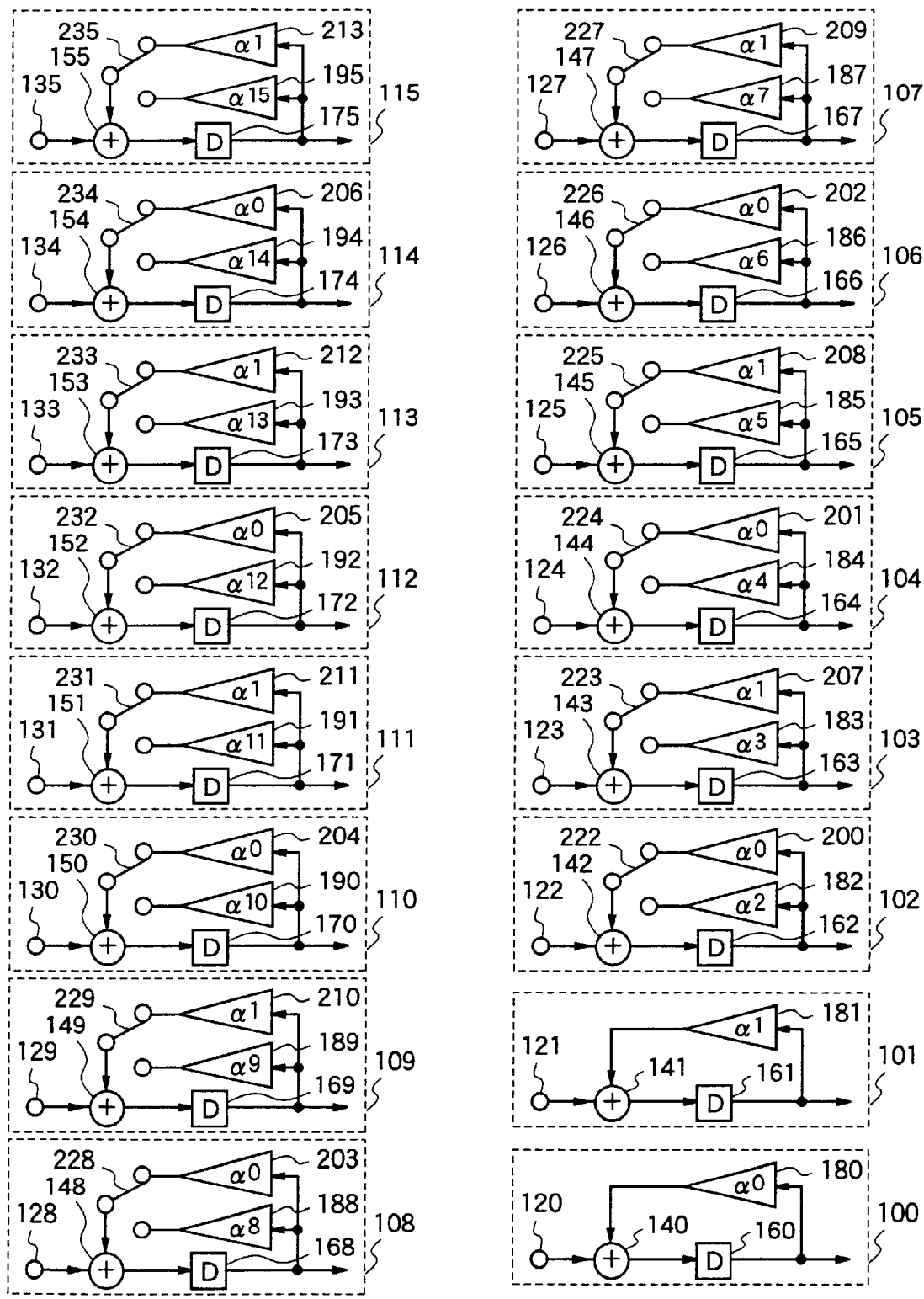
FIG. 1 is a block diagram illustrating the structure of a syndrome calculation circuit according to an embodiment of the present invention.
Figure 2:
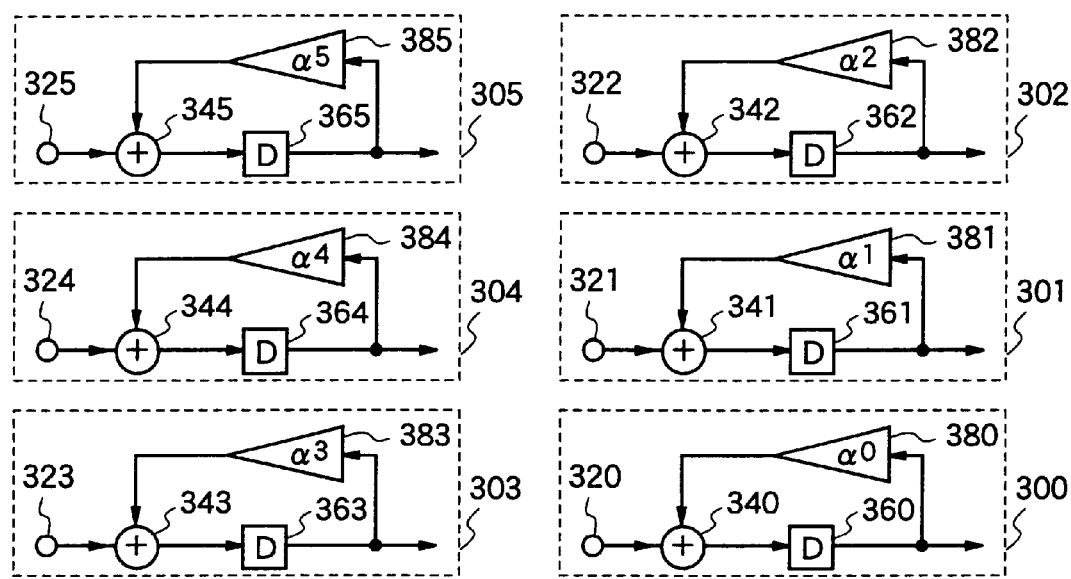
FIG. 2 is a block diagram illustrating the structure of the conventional syndrome calculation circuit.

FIG. 1 is a block diagram illustrating the structure of a syndrome calculation circuit used in a data error correction apparatus according to an embodiment of the present invention.

In this embodiment, when the syndrome calculation circuit comprises sixteen units of syndrome calculators for one code word of an octuple error correcting Reed-Solomon code for a DVD-ROM, eight code words of a single error correcting Reed-Solomon code for a CD-ROM are processed in parallel at one time. To be specific, as shown in FIG. 1, the syndrome calculation circuit according to the present invention comprises sixteen units of syndrome calculators 100~115 for the octuple error correcting Reed-Solomon code of the DVD-ROM. These syndrome calculators 100~115 comprise data input terminals 120~135, Galois field adders 140~155, flip-flops 160~175 as delay units, and first constant multipliers 180~195 for calculating the 0th to 15th powers of an element α of Galois field (hereinafter referred to as $\alpha^{\wedge}0 \sim \alpha^{\wedge}15$).

Furthermore, in order to realize parallel processing of syndromes of the single error correcting Reed-Solomon code for the CD-ROM, the syndrome calculation circuit further comprises second constant multipliers 200~213 included in the syndrome calculators 102~115 which are remaining syndrome calculators when excluding two syndrome calculators of lower correcting abilities (100 and 101) from the sixteen syndrome calculators 100~115. These second constant multipliers 200~213 are used for calculating syndromes of the single error correcting Reed-Solomon code of the CD-ROM, and calculate the elements $\alpha^{\wedge}0$ and $\alpha^{\wedge}1$ of Galois field. Further, the syndrome calculation circuit comprises selectors 222~235 for connecting the adders 142~155 to either the first constant multipliers 182~195 or the second constant multipliers 200~213. That is, the respective syndrome calculators 102~115 are provided with the second constant multipliers 200~206 for obtaining $\alpha^{\wedge}0$ and the second constant multipliers 207~213 for obtaining $\alpha^{\wedge}1$, and the selectors 222~235 for selecting either the first constant multipliers or the second constant multipliers, thereby constituting eight pairs of syndrome calculators for the single error correcting Reed-Solomon codes, i.e., 101 and 101, 102 and 103, 104 and 105, 106 and 107, 108 and 109, 110 and 111, 112 and 113, 114 and 115.

Next, the operation of the syndrome calculation circuit will be described. When calculating syndromes of the octuple error correcting Reed-Solomon code of the DVD-ROM, 16 syndromes are calculated for one code word. In this case, since the Galois field elements $\alpha^{\wedge}0 \sim \alpha^{\wedge}15$ are calculated, the selectors 222~235 included in the syndrome calculators 102~115 are connected to the first constant multipliers 182~195. Then, with respect to the one code word of the octuple error correcting Reed-Solomon code of the DVD-ROM, data are successively input to the input terminals 120~135 of the syndrome calculators 100~115, starting from the head data. Every time the data are input to the respective input terminals 120~135, the data held in the flip-flops 160~175 are subjected to constant multiplication in the first constant multipliers 180~195, and the constant-multiplied data and the input data are added in the adders 140~155. Then, the data held in the flip-flops 160~175 are updated with the data output from the adders 140~155. In this way, syndromes of the octuple error correcting Reed-Solomon code are calculated. These syndromes are calculated according to the formulae (1)~(3) described for the prior art and, therefore, repeated description is not necessary.

On the other hand, when calculating syndromes of the single error correcting Reed-Solomon code for the CD-ROM, two syndromes are calculated for one cord word. In this case, since the Galois field elements $\alpha^0$ and $\alpha^1$ are calculated, the selectors 222~235 in the syndrome calculators 102~115 are connected to the second constant multipliers 200~213. Then, the first code word of the single error correcting Reed-Solomon code is subjected to syndrome calculation by the syndrome calculators 100 and 101, the second code word by the syndrome calculators 102 and 103, the third cord word by the syndrome calculators 104 and 105, the fourth code word by the syndrome calculators 106 and 107, the fifth code word by the syndrome calculators 108 and 109, and the sixth code word by the syndrome calculators 110 and 111, the seventh code word by the syndrome calculators 112 and 113, and the eighth code word by the syndrome calculators 114 and 115. With respect to the first to eighth code words, data are input to the input terminals 120~135 of the syndrome calculators 100~115, starting from the head data. Every time the data are input to the input terminals 120~135, the data held by the flip-flops 160~175 are subjected to constant multiplication in the first constant multipliers 180 and 181 and the second constant multipliers 200~213, and the constant-multiplied data and the input data are added in the adders 140~155 and, thereafter, the data held in the flip-flops 160~175 are updated with the output data from the adders 140~155, whereby syndromes of the single error correcting g Reed-Solomon code are calculated.

In this way, in one syndrome calculation, eight code words can be processed in parallel when calculating syndromes of the single error correcting Reed-Solomon code while only one cord word is processed for the octuple error correcting Reed-Solomon code. Accordingly, syndrome calculation for eight code words of the single error correcting Reed-Solomon can be performed in parallel by effectively utilizing all of the syndrome calculators 100~115 which are used for calculating syndromes of the octuple error correcting Reed-Solomon code. As the result, the error correcting speed can be increased.

Figure 3:
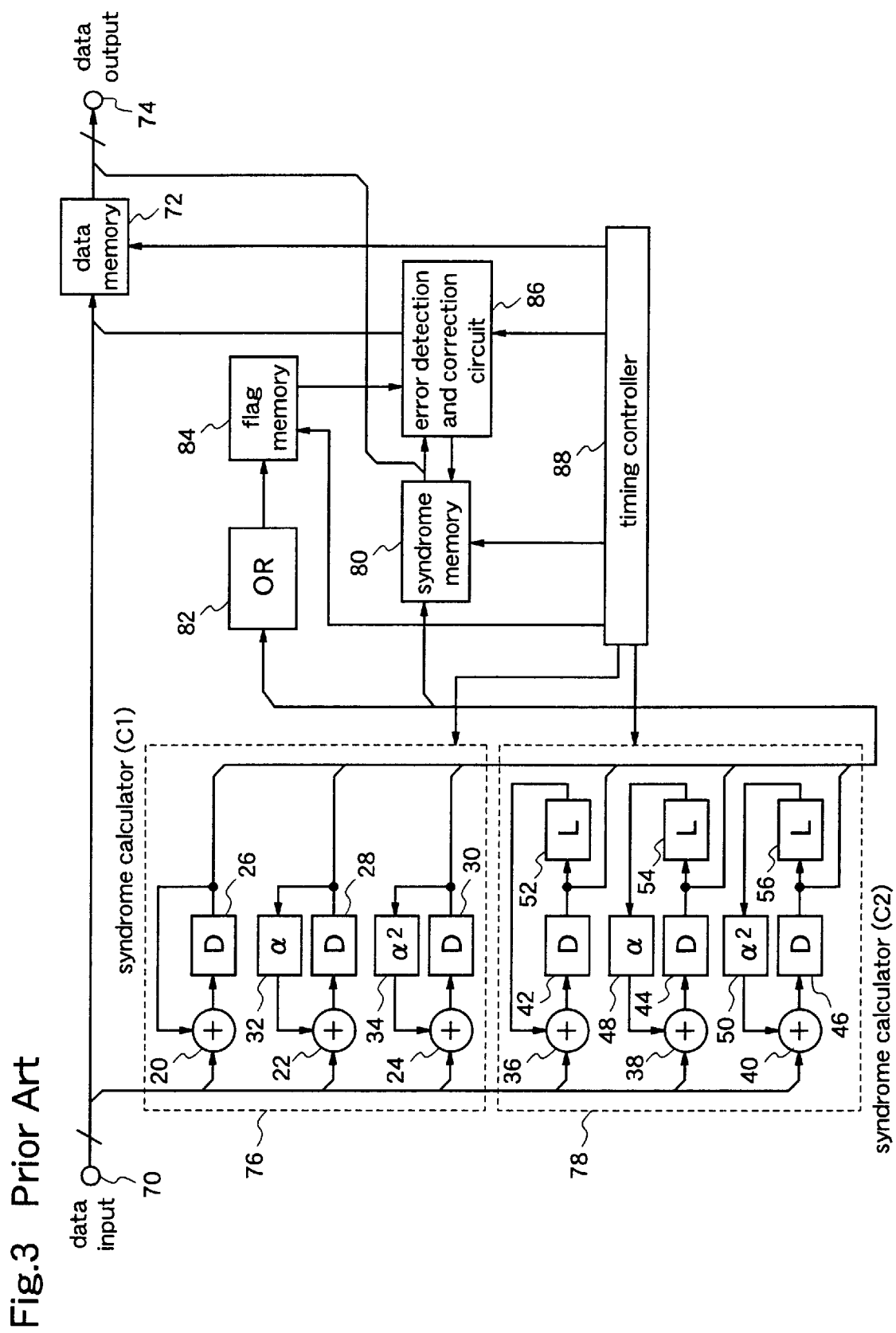
FIG. 3 is a block diagram illustrating the structure of the conventional data error correction apparatus.

The syndrome calculators 100~115 can be incorporated in, for example, the data error correcting apparatus shown in FIG. 3.

In the above-described embodiment of the invention, the first and second constant multipliers are paired as follows in each syndrome calculator: $\alpha^{15}$ and $\alpha^1$ in the syndrome calculator 115, $\alpha^{14}$ and $\alpha^0$ in the syndrome calculator 114, $\alpha^{13}$ and $\alpha^1$ in the syndrome calculator 113, $\alpha^{12}$ and $\alpha^0$ in the syndrome calculator 112, $\alpha^{11}$ and $\alpha^1$ in the syndrome calculator 111, $\alpha^{10}$ and $\alpha^0$ in the syndrome calculator 110, $\alpha^9$ and $\alpha^1$ in the syndrome calculator 109, $\alpha^8$ and $\alpha^0$ in the syndrome calculator 108, $\alpha^7$ and $\alpha^1$ in the syndrome calculator 107, $\alpha^6$ and $\alpha^0$ in the syndrome calculator 106, $\alpha^5$ and $\alpha^1$ in the syndrome calculator 105, $\alpha^4$ and $\alpha^0$ in the syndrome calculator 104, $\alpha^3$ and $\alpha^1$ in the syndrome calculator 103, and $\alpha^2$ and $\alpha^0$ in the syndrome calculator 102, and either the first constant multiplier or the second constant multiplier is selected in each syndrome calculator. However, the combination of the first and second multipliers is not restricted to above.

Further, in the embodiment of the invention, the syndrome calculators 100 and 101 are not provided with second constant multipliers and selectors. However, these syndrome calculators 100 and 101 may have second constant multipliers and selectors.

Furthermore, in the embodiment of the invention, all of the syndrome calculators for the error correcting code having relatively high error-correcting ability are used for parallel processing of eight code words of the error correcting code having relatively low error-correcting ability. However, since the object of the present invention, i.e., to increase the error correcting speed, can be achieved when the syndrome calculation for the low error-correcting ability code is performed on at least two code words in parallel. Therefore, the syndrome calculation for the low error-correcting ability code may be performed on two, three, four or more code words in parallel by utilizing some of the syndrome calculators for the high error-correcting ability code.

Further, the data error correction apparatus of the invention is constructed to process two kinds of error correcting codes having different error correcting abilities, i.e., the octuple error correcting code and the signal error correcting code. However, the error data correction apparatus of the present invention may have constant multipliers for calculating plural elements of Galois field and selectors for selecting one of these constant multipliers, for processing three or more kinds of error correcting codes having different abilities, for example, the octuple error correcting code, the double error correcting code, and the single error correcting code.

Furthermore, while the error correction apparatus of the present invention is applied to the octuple error correcting code and the single error correcting code, it may be applied to arbitrarily selected two or more error correcting codes of different abilities, for example, the octuple error correcting code and the double error correcting code, the octuple error correcting code and the triple error correcting code, or the quintuple error correcting code and the single error correcting code.

What is claimed is:

1. A data error correction apparatus for correcting errors in data to which an n-fold (n: integer, $n \geq 1$) error correcting BCH code is added, said n being equal to or larger than 2t (t: integer, $t \geq 1$), said apparatus including 2n units of syndrome calculators each comprising a first constant multiplier for obtaining an element of Galois field which is used for calculating syndromes of the n-fold ($n \geq 2t$) error correcting BCH code, an adder for adding data obtained in the first constant multiplier and input data supplied from an input terminal, and a delay unit for updating the retained data with the data output from the adder, wherein:

when correcting errors in data to which a t-fold error correcting BCH code is added, in order that the number of code words to be processed in parallel by syndrome calculation for the t-fold error correcting BCH becomes at least twice as large as the number of code words to be processed by syndrome calculation for the n-fold ($n \geq 2t$) error correcting BCH code, at least 2t units of syndrome calculators among the 2n units of syndrome calculators, other than 2t units of syndrome calculators having relatively low error-correcting abilities, are each provided with a second constant multiplier for obtaining an element of Galois field, which is used for calculating syndromes of the t-fold error correcting BCH code, and a selector for connecting the adder to one of the first constant multiplier and the second constant multiplier.

* * * * *